United States Patent
Saito et al.

(10) Patent No.: US 11,068,367 B2
(45) Date of Patent: Jul. 20, 2021

(54) STORAGE SYSTEM AND STORAGE SYSTEM CONTROL METHOD

(71) Applicant: HITACHI, LTD., Tokyo (JP)

(72) Inventors: Hideo Saito, Tokyo (JP); Yoshinori Ohira, Tokyo (JP); Masakuni Agetsuma, Tokyo (JP); Hiroto Ebara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 82 days.

(21) Appl. No.: 16/569,964

(22) Filed: Sep. 13, 2019

(65) Prior Publication Data

US 2020/0201724 A1 Jun. 25, 2020

(30) Foreign Application Priority Data

Dec. 20, 2018 (JP) .............................. JP2018-238947

(51) Int. Cl.
*G06F 11/00* (2006.01)
*G06F 11/20* (2006.01)
*H03M 13/15* (2006.01)
*G06F 11/07* (2006.01)

(52) U.S. Cl.
CPC ...... *G06F 11/2094* (2013.01); *G06F 11/0793* (2013.01); *G06F 11/2056* (2013.01); *G06F 11/2089* (2013.01); *H03M 13/154* (2013.01); *G06F 2201/82* (2013.01)

(58) Field of Classification Search
CPC .... G06F 3/061; G06F 3/0613; G06F 11/0793; G06F 11/1616; G06F 11/2053; G06F 11/2071; G06F 11/2089; G06F 11/2092; G06F 11/2094
See application file for complete search history.

(56) References Cited

U.S. PATENT DOCUMENTS

| | | | |
|---|---|---|---|
| 7,149,858 B1* | 12/2006 | Kiselev | G06F 11/2076 711/162 |
| 10,013,200 B1* | 7/2018 | Shveidel | G06F 3/0613 |
| 10,338,851 B1* | 7/2019 | Kronrod | G06F 3/0659 |
| 2020/0192589 A1* | 6/2020 | Mehta | G06K 9/6256 |

FOREIGN PATENT DOCUMENTS

WO 2016/075779 A1 5/2016

* cited by examiner

*Primary Examiner* — Michael Maskulinski
(74) *Attorney, Agent, or Firm* — Volpe Koenig

(57) ABSTRACT

While an extra storage resource required for an operation of IaaS/PaaS is reduced, an SLA on storage performance is maintained even upon a failure. In a storage system including a plurality of storage nodes for providing storage regions for storing data of a computer on which an application is executed, a normal mode to be set in a normal state and an emergency mode in which a predetermined function is suppressed compared with the normal mode are prepared as a process mode for a request for input and output of data. In the storage system, in response to the occurrence of a failure in a first storage node, the process mode is switched to the emergency mode for a second storage node in which the failure does not occur.

15 Claims, 17 Drawing Sheets

FIG. 6

| VOL ID | PORT ID | LUN | DATA PROTECTION MODE | I/O PROCESSING MODE |
|---|---|---|---|---|
| 0 | 0 | 0 | MIRRORING | NORMAL |
| 100 | 0 | 1 | MIRRORING | NORMAL |
| 200 | 1 | 0 | ERASURE CODING | HIGH-SPEED |
| ... | ... | ... | ... | ... |

FIG. 16

| VOL ID | PORT ID | LUN | DATA PROTECTION MODE | I/O PROCESSING MODE | APPLICATION-LEVEL REPLICATION |
|---|---|---|---|---|---|
| 0 | 0 | 0 | MIRRORING | NORMAL | NO |
| 100 | 0 | 1 | MIRRORING | NORMAL | YES |
| 200 | 1 | 0 | ERASURE CODING | HIGH-SPEED | YES |
| ... | ... | ... | ... | ... | ... |

2281 2282 2283 2284 2285 2286 228

STORAGE SYSTEM AND STORAGE SYSTEM CONTROL METHOD

BACKGROUND

The present invention relates to a storage system and a method for controlling a storage system, and is suitable to be applied to a storage system and a method for controlling a storage system, which provide resources to multiple tenants by IaaS/PaaS.

In recent years, IT departments of companies and service providers have increasingly provided Infrastructure as a Service (IaaS) and Platform as a Service (PaaS) to business departments of companies. Each of the IaaS/PaaS providers needs to maintain a service level agreement (SLA) on storage performance for multiple tenants that share resources.

For example, International Publication No. 2016/075779 discloses a storage device that may guarantee, even upon a failure, performance for local segments that guarantee required performance. In the storage device disclosed in International Publication No. 2016/075779, resources (CPU, memory, and the like) of a storage system are divided into logical partitions. In the storage device, when an overload is applied to a logical partition due to a failure, a resource is allocated from another logical partition so that performance for each tenant is maintained.

SUMMARY

However, in a scale-out storage system that is generally used for IaaS/PaaS, even when an available resource exists in a cluster upon a failure, the resource is allocated only in a node. Thus, there is a problem that a load of a remaining node increases and the quality of a service able to be provided to tenants is reduced. According to the technique disclosed in International Publication No. 2016/075779, to avoid the problem, it is expected that storage performance is maintained by allocating a resource from another logical partition. Thus, there is another problem that many extra storage resources need to be included in the node to maintain performance upon a failure and the cost is high.

The invention has been devised under the aforementioned circumstances and provides a storage system and a method for controlling a storage system, which reduce an extra storage resource required for an operation of IaaS/Paas and maintain an SLA on storage performance even upon a failure.

To solve the problems, according to an aspect of the invention, a storage system includes a plurality of storage nodes for providing storage regions for storing data of a computer in which an application is executed. The storage system has a normal mode to be set in a normal state and an emergency mode in which a predetermined function is suppressed compared with the normal mode as a process mode for a request for input and output of data. In the storage system, in response to the occurrence of a failure in a first storage node among the plurality of storage nodes, the process mode is switched to the emergency mode for a second storage node that is among the plurality of storage nodes and in which the failure does not occur.

In addition, according to another aspect of the invention, a method for controlling a storage system including a plurality of storage nodes for providing storage regions for storing data of a computer in which an application is executed is provided. In the method, the storage system has a normal mode to be set in a normal state and an emergency mode in which a predetermined function is suppressed compared with the normal mode as a process mode for a request for input and output of data. In the method, in response to the occurrence of a failure in a first storage node among the plurality of storage nodes, the process mode is switched to the emergency mode for a second storage node that is among the plurality of storage nodes and in which the failure does not occur.

According to the invention, it is possible to reduce an extra storage resource required for an operation of IaaS/PaaS and maintain an SLA on storage performance even upon a failure.

BRIEF DESCRIPTION OF THE DRAWINGS

FIG. 6 is a diagram describing an example of a data configuration of a VOL management table.

FIG. 16 is a diagram describing an example of a data configuration of a VOL management table according to the second embodiment.

DETAILED DESCRIPTION

Figure 1:
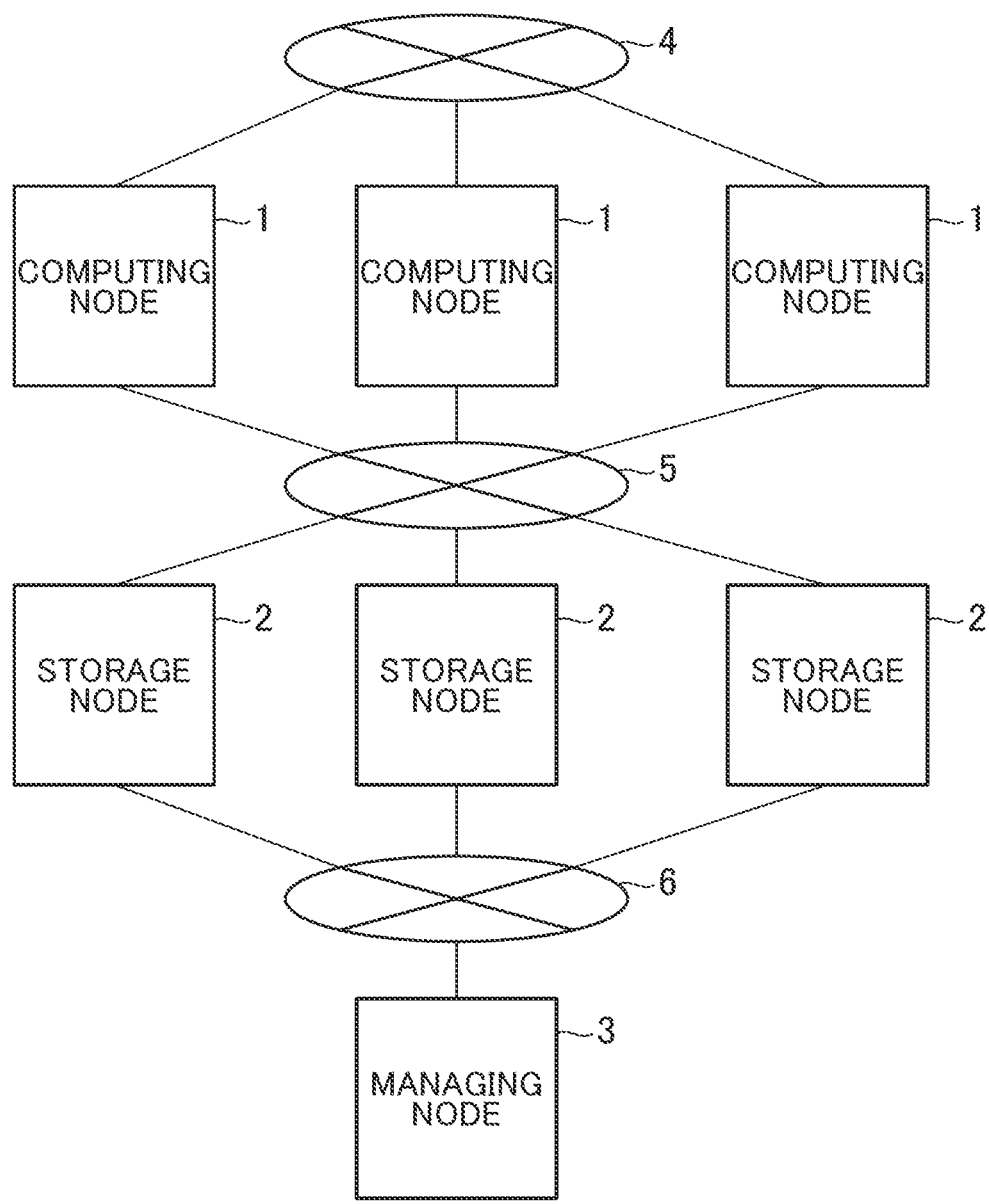
FIG. 1 is a block diagram depicting an example of an entire configuration of a storage system according to a first embodiment.

Hereinafter, embodiments of the invention are described with reference to the accompanying drawings. In the drawings, components having the same or similar function and configuration are indicated by the same numbers, and alphabetical suffixes are added to components having the same function and configuration to identify each of the components. In the present specification, in the case where all components having the same function and configuration are described, alphabetical suffixes are not added to the components in some cases.

(1) First Embodiment

(1-1) Configuration of Storage System

FIG. 1 is a block diagram depicting an example of an entire configuration of a storage system according to a first embodiment. As depicted in FIG. 1, the storage system according to the first embodiment is a scale-out storage system in which a cluster is built by coupling multiple nodes (storage nodes 2) to each other. The storage system is configured by connecting multiple computing nodes 1, the multiple storage nodes 2, and a managing node 3 to each other via networks 4, 5, and 6.

The computing nodes 1 are connected to the multiple storage nodes 2 via the network 5 (storage area network (SAN)). Each of the computing nodes 1 issues a request for input and output (I/O) of user data. Each of the I/O requests issued by the computing nodes 1 is transmitted to all the storage nodes 2 (more specifically, I/O controllers 203 depicted in FIG. 3). The computing nodes 1 may be general physical servers or computers. Hardware configurations of the computing nodes 1 will not be described in detail. In the computing nodes 1, applications (hereinafter also referred to as apps) and middleware are executed.

Figure 2:
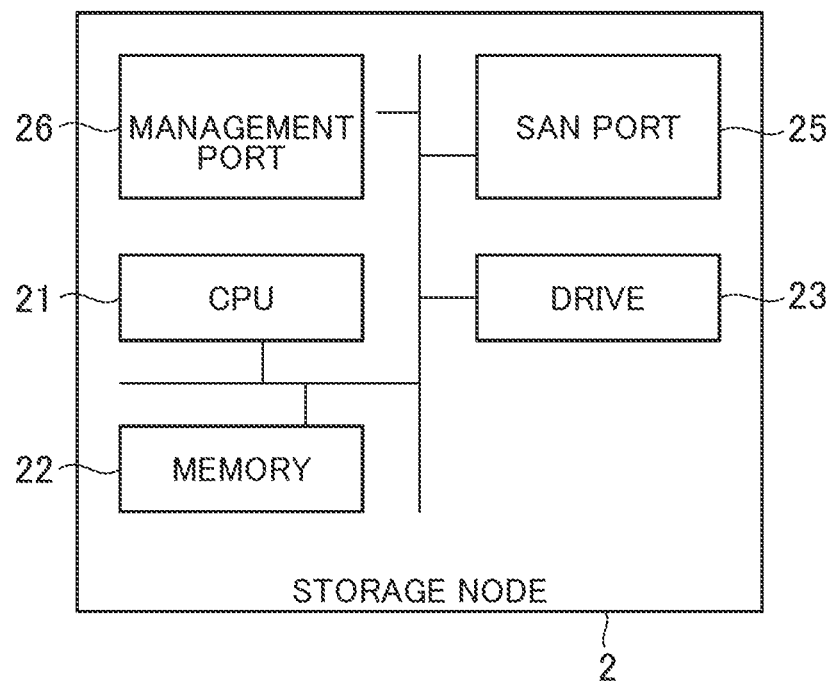
FIG. 2 is a block diagram depicting an example of a hardware configuration of a storage node depicted in FIG. 1.

The storage nodes 2 provide a clustered storage space formed by coupling the multiple storage nodes 2 to each other. FIG. 2 is a block diagram depicting an example of a hardware configuration of each of the storage nodes depicted in FIG. 1. As depicted in FIG. 2, the storage node 2 is a general storage device and includes a central processing unit (CPU) 21, a nonvolatile memory 22, a drive 23, a SAN port 25, and a management port 26, which are connected to each other via a bus. The CPU 21 executes a process of controlling the entire storage node 2. The nonvolatile memory 22 stores data to be used mainly by the CPU 21. The drive 23 is a storage medium for a logical volume. The SAN port 25 is used for a connection of the SAN (network 5). The management port 26 is used for a connection of the management network (network 6).

The managing node 3 is connected to the multiple storage nodes 2 via the network 6 (management network) and configured to manage the entire storage system. The managing node 3 may be a general physical server. A hardware configuration of the managing node 3 will not be described in detail.

Figure 3:
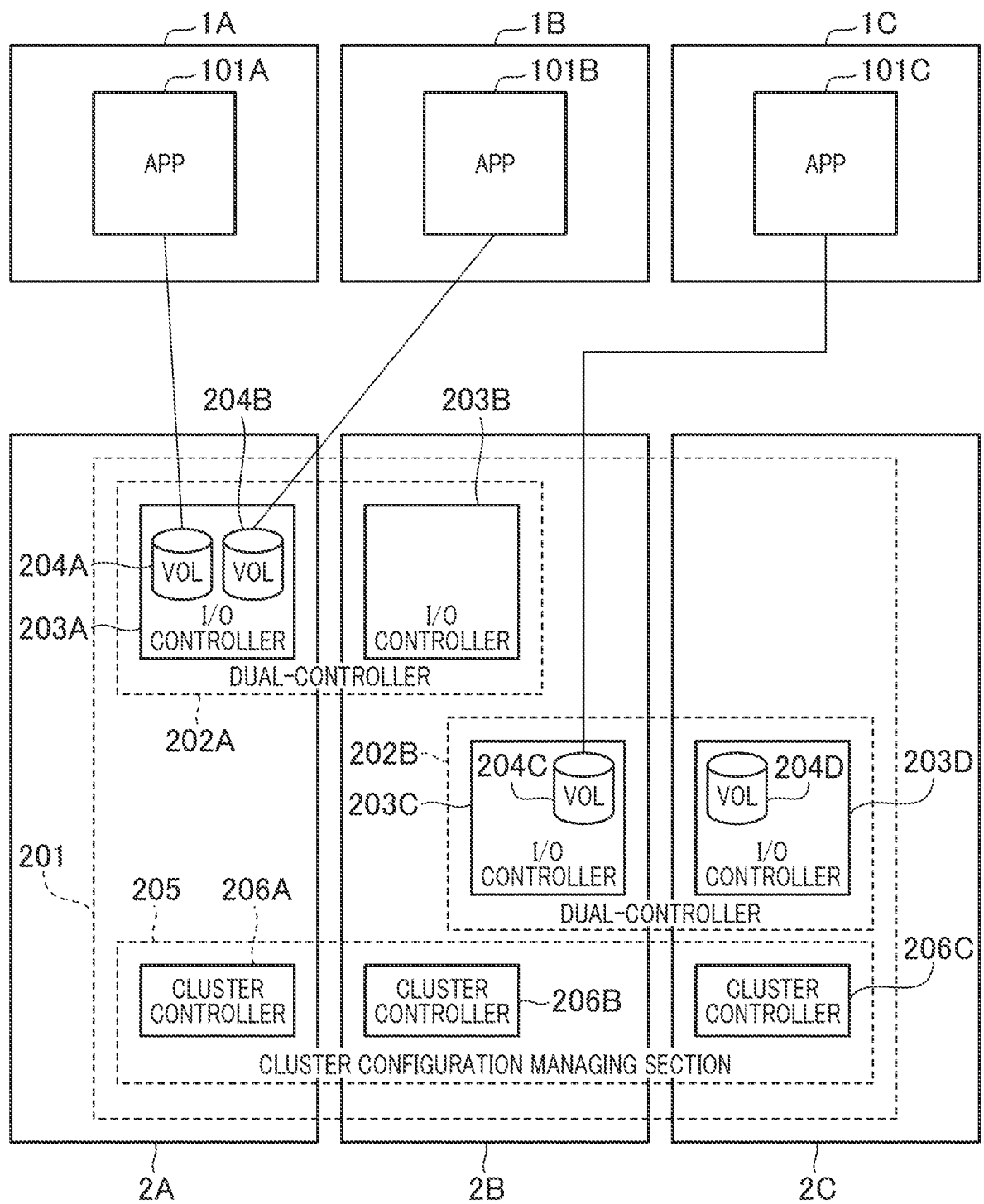
FIG. 3 is a block diagram depicting an example of software architecture in the storage system depicted in FIG. 1.

FIG. 3 is a block diagram depicting an example of software architecture in the storage system depicted in FIG. 1.

As depicted in FIG. 3, in the storage system according to the first embodiment, the cluster 201 is built by coupling the multiple storage nodes 2 (2A to 2C) to each other. When the storage system is used to provide IaaS/PaaS, storage resources within the cluster 201 are shared by multiple tenants, and logical volumes of the storage resources are partitioned by logical partitions or the like and provided to the tenants.

As software architecture, the cluster 201 includes multiple dual-controllers 202 (202A and 202B) for controlling input and output (I/O) of data and a cluster configuration managing section 205 for managing the configuration of the cluster 201.

Each of the dual-controllers 202 (202A and 202B) includes two I/O controllers 203 (among I/O controllers 203A to 203D). Each of the I/O controllers 203 controls input and output of data to and from a volume (VOL) 204 (among volumes 204A to 204D) managed by the concerned I/O controller 203 and included in a concerned storage node 2 including the concerned I/O controller 203 in accordance with I/O requests issued by the apps 101 (101A to 101C) of the computing nodes 1 and the middleware (not depicted).

In addition, the cluster configuration managing section 205 is comprised of multiple cluster controllers 206 (206A to 206C) for controlling a process to be executed on the entire cluster 201. For example, the cluster configuration managing section 205 controls the configuration of the cluster 201 based on a management operation from the managing node 3. The configuration depicted in FIG. 3 is a portion of the configuration of the storage system according to the first embodiment and does not indicate the entire configuration. For example, a slave volume (VOL) 204 is not depicted.

In FIG. 3, the dual-controller 202A is comprised of the I/O controller 203A and the I/O controller 203B that execute failover between the I/O controllers 203A and 203B. The I/O controllers 203A and 203B operate while having a relationship between an active I/O controller and a passive I/O controller. For example, when the I/O controller 203A is active in a normal state, the I/O controller 203B is passive and is used when a failure occurs in the I/O controller 203A.

The dual-controller 202B is comprised of the I/O controller 203C and the I/O controller 203D that execute failover between the I/O controllers 203C and 203D. The I/O controllers 203C and 203D are active and operate in the normal state (and have a relationship between an active I/O controller and an active I/O controller).

As described above, FIG. 3 depicts the two dual-controllers 202A and 202B that are of different operational types. It is, however, sufficient if the storage system according to the first embodiment has a configuration in which the dual-controllers 202 form respective clusters and have relationships between active and passive I/O controllers and between active and active I/O controllers. The operational types of the dual-controllers 202A and 202B and combinations of the dual-controllers 202A and 202B are not limited.

(1-2) Various Data

Figure 4:
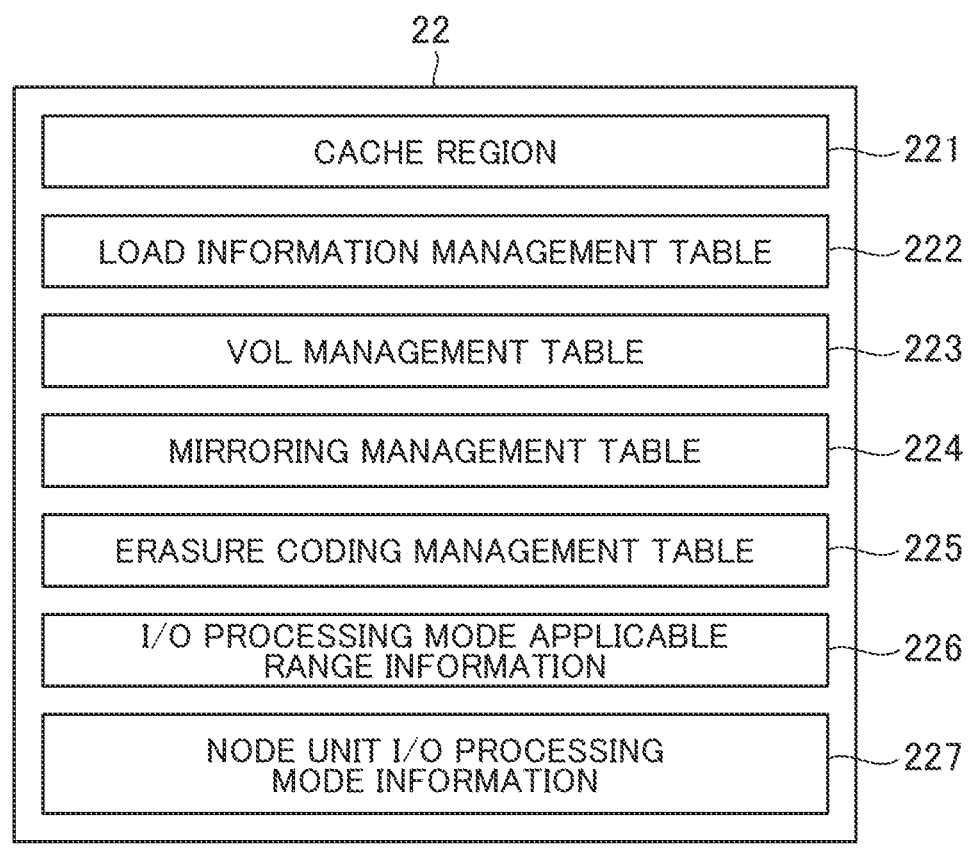
FIG. 4 is a diagram describing data stored in a memory.

FIG. 4 is a diagram describing data stored in the memory. FIG. 4 depicts an example of data stored in the memory 22 of the storage node 2 and required for a process by the I/O controllers 203 forming each of the duel-controllers 202.

When the data stored in the memory 22 is treated in units of the I/O controllers 203, two I/O controllers 203 forming each of the dual-controllers 202 hold consistent information. For example, in the dual-controller 202A, information on the volumes 204A and 204B is held by the I/O controllers 203A and 203B. Thus, when one of the I/O controllers 203A and 203B fails and is down, the other of the I/O controller 203A and 203B can continuously execute a process of the failed I/O controller.

The memories 22 of the storage nodes 2 do not need to hold information of the entire cluster (for example, the storage nodes 2A to 2C). FIG. 4 is not limited to the case where details of data held in the dual-controller 202A are the same as or similar to details of data held in the dual-controller 202B that is of the different type from the dual-controller 202A. Details of data held in one of the dual-controllers 202 may be different from details of data held in the other of the dual-controllers 202. Thus, for example, information held in the memory 22 of the storage node 2A including one of the I/O controllers 203 of the dual-controller 202A may be partially different from information held in the memory 22 of the storage node 2B including the other of the I/O controllers 203 of the dual-controller 202A and one of the I/O controllers 203 of the dual-controller 202B.

FIG. 4 depicts a cache region 221, a load information management table 222, a volume (VOL) management table 223, a mirroring management table 224, an erasure coding management table 225, I/O process mode applicable range information 226, and node unit I/O process mode information 227 as a specific example of the data stored in the memory 22.

Figure 5:
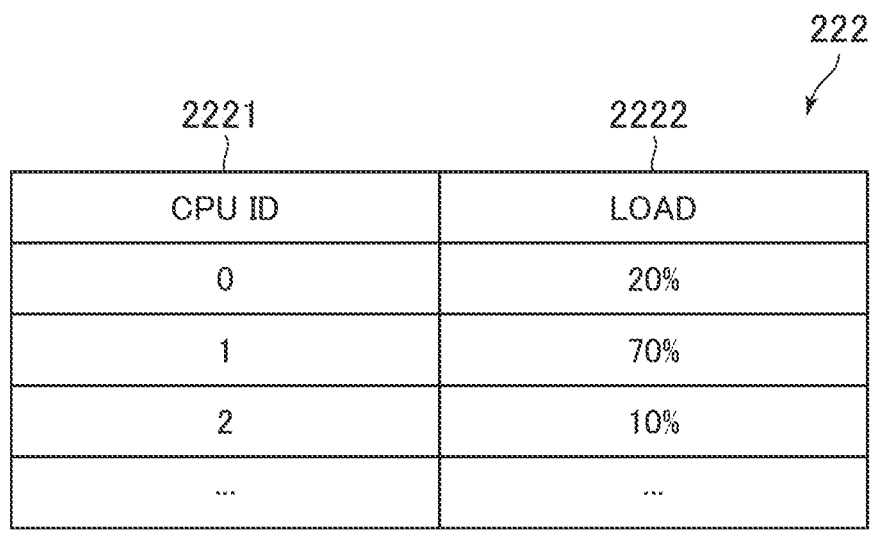
FIG. 5 is a diagram describing an example of a data configuration of a load information management table.

FIG. 5 is a diagram describing an example of a data configuration of the load information management table. The load information management table 222 is a data table indicating load states of the CPU 21 in the concerned storage node 2 in units of I/O controllers 203. When the load information management table 222 is a table exemplified in FIG. 5, the load information management table 222 indicates utilization (load 2222) of CPU cores (CPU ID 2221) controllable by an I/O controller 203 to be managed using the table. By referring to the load 2222, whether each of the load states is an overload can be determined.

FIG. 6 is a diagram describing an example of a data configuration of the VOL management table. The VOL management table 223 is a data table indicating usage states of volumes 204 (drive 23) of the storage node 2. When the VOL management table 223 is a table exemplified in FIG. 6, the VOL management table 223 indicates, for each of identifiers (indicated in VOL ID 2231) of the volumes, an ID (port ID 2232) of a port, a logical unit number (LUN 2233), a data protection mode 2234 indicating the type of a data protection mode, and an I/O process mode 2235 indicating an execution mode related to an I/O process.

In the first embodiment, the data protection mode 2234 is described below using mirroring and erasure coding. Techniques for protecting data using the mirroring and the erasure coding (this example assumes distribution erasure coding) is known and will not be described in detail. When the mirroring and the erasure coding are applied to the scale-out storage system, data can be duplicated or distributed to and written to volumes 204 (for example, different volumes 204 to be controlled by multiple I/O controllers 203 included in a dual controller 202) of different storage nodes 2 so as to protect the data and improve the reliability of the data.

When the data protection mode 2234 is "mirroring" in the VOL management table 223, a destination to which the data is to be written (or a destination from which the data is to be read) can be determined by referring to the mirroring management table 224 depicted in FIG. 7 described later. In addition, when the data protection mode 2234 is "erasure coding" in the VOL management table 223, the destination to which the data is to be written (or the destination from which the data is to be read) can be determined by referring to the erasure coding management table 225 depicted in FIG. 8 described later.

In the I/O process mode 2235, types that are a "normal (mode)" indicating an I/O process mode in the normal state and a "high-speed (mode)" are described. In the first embodiment, the "high-speed mode" is prepared as an emergency mode in which I/O processes of reading and writing are executed at higher speeds than the normal mode by reducing or suppressing (degrading) functionality of a storage service. Although details are described later with reference to FIG. 9, the I/O process mode can be switched from the normal mode to the high-speed mode via a predetermined determination process when a failure occurs and failover is executed or the like in the storage system according to the first embodiment.

The high-speed mode according to the first embodiment is described below in detail. The high-speed mode is an I/O process mode in which processing loads of the I/O controllers 203 in the I/O processes are reduced compared with the normal mode. Specific examples of the suppression of the functionality of the storage service are the stop of compression and deduplication and the stop of data protection by the distributed erasure coding, the mirroring, and the like.

The compression and deduplication are techniques efficient to reduce capacity consumption of data and are generally used in an I/O process executed on data. The execution of the compression and deduplication of data in an I/O process may cause loads to be applied to the I/O controllers 203.

When the compression and the deduplication are stopped due to the high-speed mode upon a node failure, an increase in capacity consumption of volumes 204 (that may be considered as a physical drive 23) is allowed until recovery of the failure, but processing loads of the I/O controllers 203 can be reduced and processing performance of the I/O controllers 203 can be improved. As a result, even when the number of available nodes within the storage system is reduced due to the stop, caused by a failure, of a function, it can be expected that high-speed processing is maintained in the entire storage system.

The distributed erasure coding and the mirroring are data protection techniques efficient to improve the reliability of data by making the data redundant and distributing or duplicating the data to another volume 204 (or drive 23) and are generally used in a storage system having multiple storage nodes. However, the execution of the data protection may cause loads to be applied to the I/O controllers 203.

When the data protection is stopped due to the high-speed mode upon a failure in a node, data is written to only the concerned node in data writing until recovery of the failure, and thus the reliability of the data is reduced. However, the data is not written to the other nodes, processing loads of the I/O controllers 203 are significantly reduced. Even when a protection level of the data protection is reduced due to the high-speed mode, the processing loads of the I/O controllers 203 can be reduced. Thus, when the data protection is stopped (or the protection level is reduced) due to the high-speed mode upon a failure in a node, a reduction in the reliability of data is allowed until recovery of the failure, but processing performance can be improved by reducing the processing loads of the I/O controllers 203. As a result, even when the number of available nodes in the storage system is reduced due to the stop, caused by a failure, of a function, it can be expected that high-speed processing is maintained in the entire storage system.

The following describes an example in which when the I/O process mode is changed to the high-speed mode, the compression and the deduplication are stopped and the data protection by the distributed erasure coding or the mirroring is stopped. In the storage system according to the first embodiment, the high-speed mode is not limited to the mode in which all the aforementioned operations are executed. It is sufficient if a function of reducing the processing loads of the I/O controllers 203 is used in the high-speed mode. For example, in the high-speed, either the stop of the compression and the deduplication or the stop of the data protection may be executed.

In the following description of the I/O processes (data reading process and data writing process), the following is explained. That is, a processing load of an I/O controller 203 in an I/O process after failover is reduced by setting the I/O process mode to the high-speed mode for a predetermined volume 204 upon a failure in a node, compared with the case where the I/O process mode is set to the normal mode.

Figure 7:
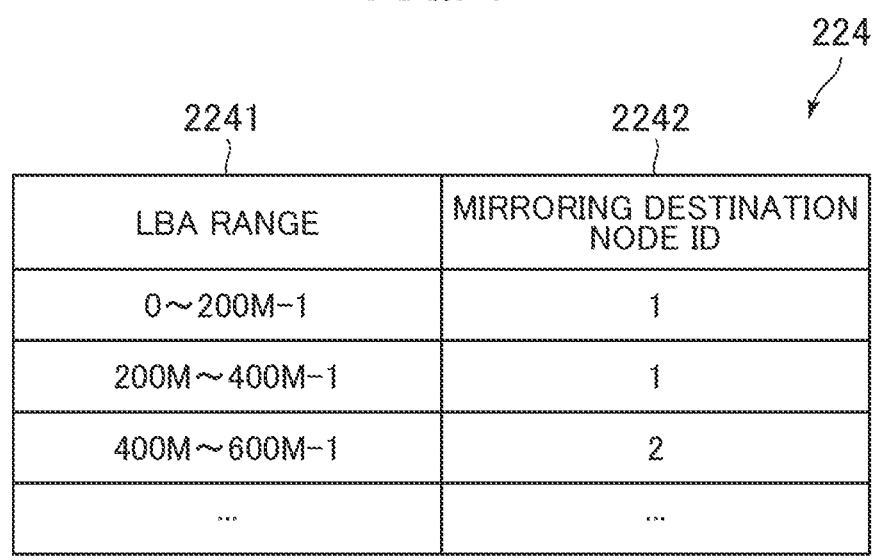
FIG. 7 is a diagram describing an example of a data configuration of a mirroring management table.

FIG. 7 is a diagram describing an example of a data configuration of the mirroring management table. The mirroring management table 224 is management information of the mirroring. When a data protection mode for the mirroring is set, the mirroring management table 224 is referred to, in order to determine a destination to or from which data is written or read. FIG. 7 depicts, for each of logical block addressing (LBA) ranges 2241, a node ID (mirroring destination node ID 2242) of a node to be subjected to the mirroring.

Figure 8:
FIG. 8 is a diagram describing an example of a data configuration of an erasure coding management table.

FIG. 8 is a diagram describing an example of a data configuration of the erasure coding management table. The erasure coding management table 225 is management information of the distributed erasure coding. When a data protection mode for the erasure coding is set, the erasure coding management table 225 is referred to, in order to determine a destination to or from which data is to be written or read. FIG. 8 depicts, for each of logical block addressing (LBA) ranges 2251, a group (erasure coding group 2252) to be subjected to the erasure coding.

The I/O process mode applicable range information 226 is used to set destinations to which the I/O process mode (normal mode/high mode) is applied, although a detailed data configuration of the I/O process mode applicable range information 226 is not depicted in detail. Destinations to which the I/O process mode is applied are set for each of the I/O controllers 203 and may be arbitrarily set in units of nodes or in units of volumes.

When destinations to which the I/O process mode is applied are set in "units of volumes" in I/O process mode applicable range information 226 on an I/O controller 203, the I/O process mode is set for volumes 204 controllable by the concerned I/O controller 203 and included in an entire concerned node including the concerned I/O controller 203. The "entire concerned node" is described using a specific supplementary example. In the storage node 2A depicted in FIG. 3, when destinations to which the I/O process mode is applied are set in "units of nodes" in I/O process mode applicable range information 226 on the I/O controller 203A, the I/O controller 203A applies the I/O process mode to all the volumes 204 controlled by the I/O controller 203A or to the volumes 204A and 204B as the entire concerned node recognizable by the I/O controller 203A. Thus, even if a volume 204 controlled by another I/O controller 203 exists in the storage node 2A, the volume 204 is excluded from the destinations to which the I/O process node is applied.

On the other hand, when the destinations to which the I/O process mode is applied are set in "units of volumes" in the I/O process mode applicable range information 226, the I/O process mode is applied to each of the volumes 204. This is described in detail using the aforementioned supplementary example. When the destinations to which the I/O process mode is applied are set in "units of volumes" in the I/O process mode applicable range information 226 on the I/O controller 203A, the I/O process mode is applied individually to the volumes 204A and 204B recognizable by the I/O controller 203A.

In addition, although a detailed data configuration is not depicted, when the I/O process mode is applied in units of nodes, the node unit I/O process mode information 227 indicates the I/O process mode (normal mode or high-speed mode) set to an entire concerned node recognizable by a concerned I/O controller 203. Specifically, the I/O process mode set in the node unit I/O process mode information 227 is valid only when destinations to which the I/O process mode is applied are set in "units of nodes" in I/O process mode applicable range information 226. When the destinations to which the I/O process mode is applied are set in "units of volumes" in the I/O process mode applicable range information 226, details set in the node unit I/O process mode information 227 are not valid.

The details of the various data required for the processes by the I/O controllers 203 are described above.

Next, various processes to be executed in the storage system according to the first embodiment are described using the configuration of the storage system depicted in FIG. 3 and the like.

(1-3) Process of Changing I/O Process Mode

Figure 9:
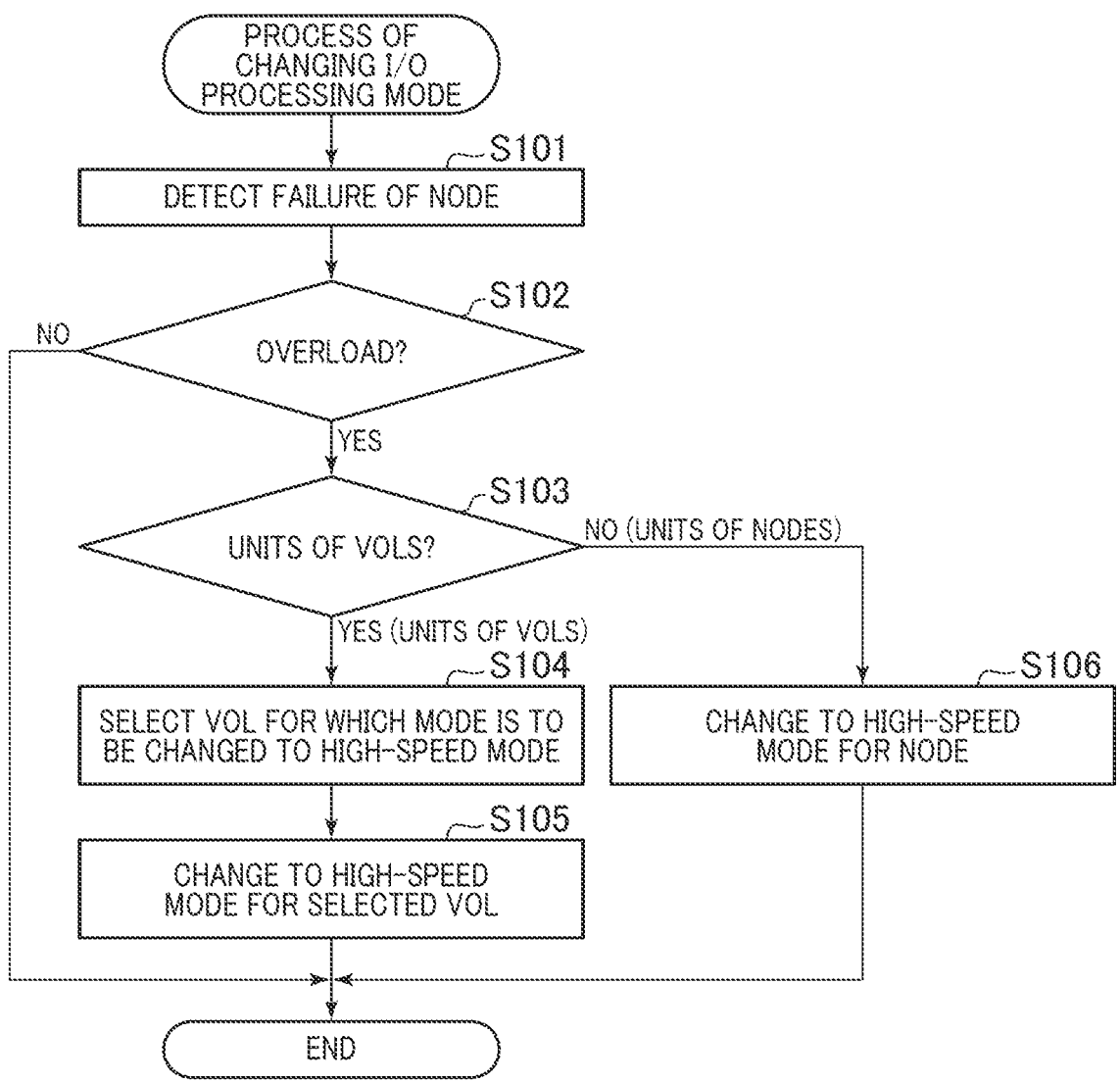
FIG. 9 is a flowchart depicting an example of a procedure for a process of changing an I/O process mode.

FIG. 9 is a flowchart depicting an example of a procedure for a process of changing the I/O process mode. The process of changing the I/O process mode is executed when a failure of a node (storage node 2) within the cluster 201 is detected. In this case, the failure indicates a failure that disables an I/O process executed on one or more of volumes 204 included in the node. In the storage system according to the first embodiment, when the failure occurs, failover from any of I/O controllers 203 included in the failed node and forming a dual-controller 202 to the other of the I/O controllers 203 forming the dual-controller 202 is executed.

It is assumed that, at the time when the process depicted in FIG. 9 is started, any failure does not occur in the storage system and the I/O process mode is set to the normal mode for the volumes 204 included in the cluster 201. In this case, the cluster controllers 206 (or the cluster configuration managing section 205) monitor whether a failure occurs in the nodes (storage nodes 2) included in the cluster 201. In the storage system according to the first embodiment, a main section for monitoring whether a failure occurs in the nodes is not limited to the cluster controllers 206 and may be a section that uses an existing technique. For example, an I/O controller 203 included in each of the nodes or a dual-controller 202 included in each of the nodes may monitor whether a failure occurs in the other nodes (other than the concerned node) within the cluster 201. When an I/O controller 203 detects the occurrence of a failure, the controller 203 may notify the occurrence of the failure to the other controllers 203.

It is assumed that, in step S101, a cluster controller 206 detects a failure of a storage node 2 (for example, the storage node 2A depicted in FIG. 3) within the cluster 201. In this case, the cluster controller 206 instructs the I/O controller 203B, which is included in the other node and forms the dual-controller 202A with the I/O controller 203A of the storage node 2A from which the failure has been detected, to execute processes of steps S102 and later.

In step S102, the I/O controller 203B refers to the load information management table 222 (refer to FIG. 5) related to the I/O controller 203B and determines whether a load state of a CPU core controllable by the I/O controller 203B is an overload. An arbitrary threshold may be set to determine whether the load state is the overload. It is preferable that the predetermined threshold be set based on calculation, an experiment, or the like so that when a processing load of the I/O controller 203B increases due to failover, and storage performance that can be provided to the tenants is not maintained at a level indicated in an SLA, the I/O controller 203B determines that the load state is the overload. In this example, when a load indicated in the load 2222 depicted in FIG. 5 is equal to or higher than "70%", the I/O controller 203B determines that the load state is the overload.

When the I/O controller 203B determines that the load state is the overload (YES in step S102), the process proceeds to step S103. When the I/O controller 203B determines that the load state is not the overload (NO in step S102), the I/O process mode is not changed and is the normal mode and the process of changing the I/O process mode is terminated.

In step S103, the I/O controller 203B refers to I/O process mode applicable range information 226 on the I/O controller 203B and determines whether destinations to which the I/O process mode is applied are set in "units of volumes". When the destinations to which the I/O process mode is applied are set in "units of volumes" (YES in step S103), the process proceeds to step S104. When the destinations to which the I/O process mode is applied are not set in "units of volumes" or are set in "units of nodes" (No in step S103), the process proceeds to step S106.

In step S104, the I/O controller 203B selects, from among volumes 204 controllable by the I/O controller 203B in the storage node 2, a volume (mode change VOL) for which the I/O process mode is to be changed to the high-speed mode. In this case, the number of mode change VOLs to be selected and a selection method are not limited. For example, it is considered that a predetermined number of volumes 204 to be selected are determined based on the magnitude of the overload. Specifically, as a load indicated in the load 2222 and corresponding to the overload state confirmed in step S102 is higher, the number (or a capacity) of mode change VOLs to be selected is larger. When the load indicated in the load 2222 is relatively low even in the overload state, the number (or the capacity) of mode change VOLs to be selected is reduced. Then, in step S105, the I/O controller 203B changes the I/O process mode to the high-speed mode for the volume 204 (mode change VOL) selected in step S104 and terminates the process of changing the I/O process mode.

In step S106, the I/O controller 203B changes the I/O process mode to the high-speed mode for all the volumes 204 controllable by the I/O controller 203B in the storage unit 2 and terminates the process of changing the I/O process mode.

The process of changing the I/O process mode according to the first embodiment is described above.

Next, the data reading process and the data writing process are described as the I/O processes in the storage system in which the process of changing the I/O process mode is executed. The following description of the I/O processes assumes that, when the I/O process mode is set to the normal mode for a certain volume 204, data stored in the certain volume 204 is compressed and deduplicated and is subjected to the data protection by the distributed erasure coding or the mirroring. In addition, the following description of the I/O processes assumes that, when the I/O process mode is set to the high-speed mode fora certain volume 204, data stored in the certain volume 204 is not compressed and not deduplicated and is not subjected to the data protection.

(1-4) Data Reading Process

Figure 10:
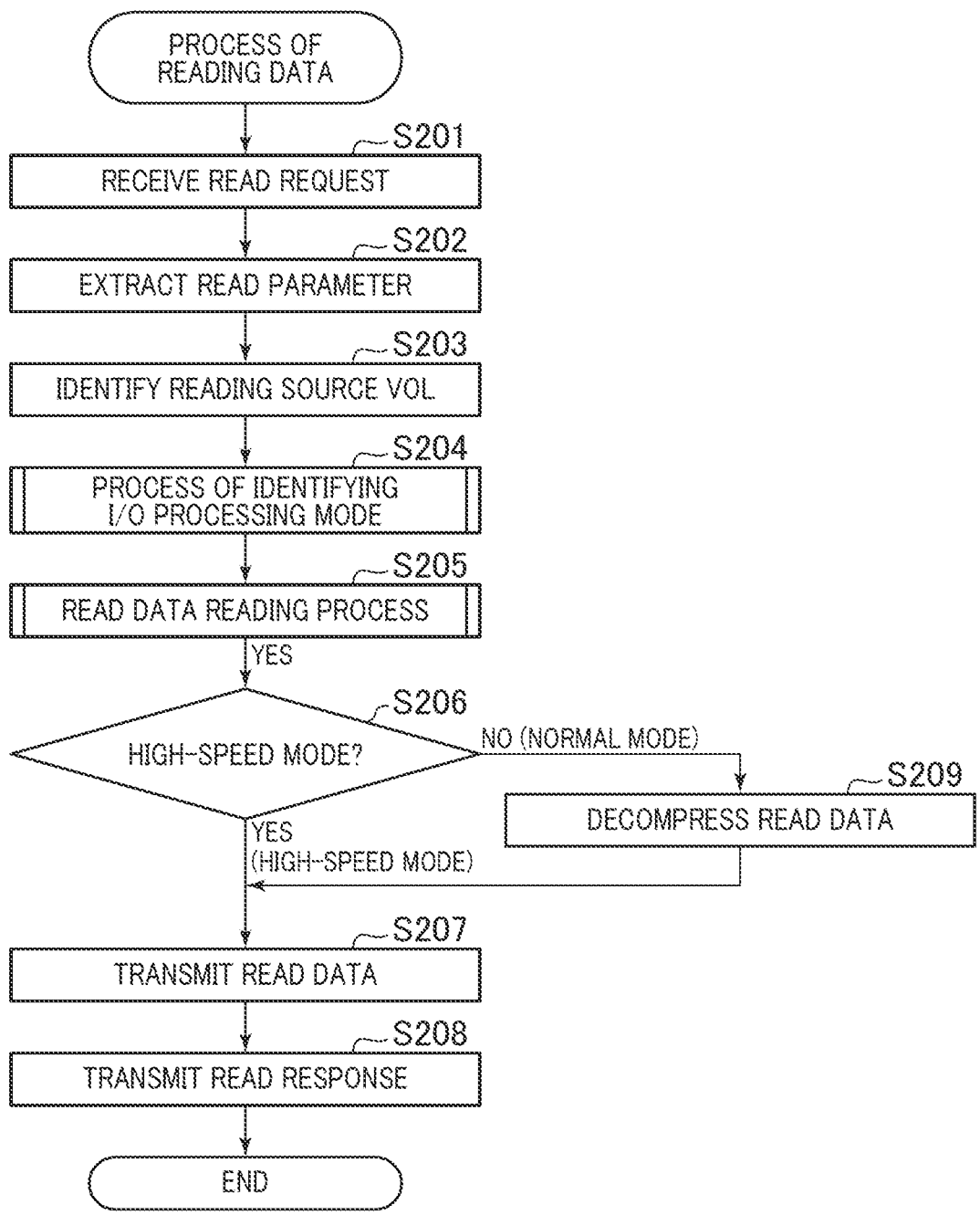
FIG. 10 is a flowchart depicting an example of a procedure for a data reading process.

FIG. 10 is a flowchart depicting an example of a procedure for the data reading process. When a computing node 1 issues a request (read request) to read data to a storage node 2, an I/O controller 203 of the storage node 2 receives the read request and executes the data reading process depicted in FIG. 10. The data reading process is executed regardless of whether the system is in the normal state or a failure occurs in the system. In the normal state, the I/O process mode is set to the normal mode for all the volumes. When a failure occurs, the I/O process mode may be set to the normal state for one or more of the volumes, and the process mode may be set to the high-speed mode for one or more of the volumes.

Referring to FIG. 10, in step S201, the I/O controller 203 receives the read request. Then, the I/O controller 203 extracts a read parameter from the read request received in step S201 (in step S202) and identifies a volume 204 (reading source VOL) holding the data (read data) to be read (in step S203).

Next, in step S204, the I/O controller 203 executes a "process of identifying the I/O process mode" to identify the I/O process mode set for the volume 204 (reading source VOL) identified in step S203.

Figure 11:
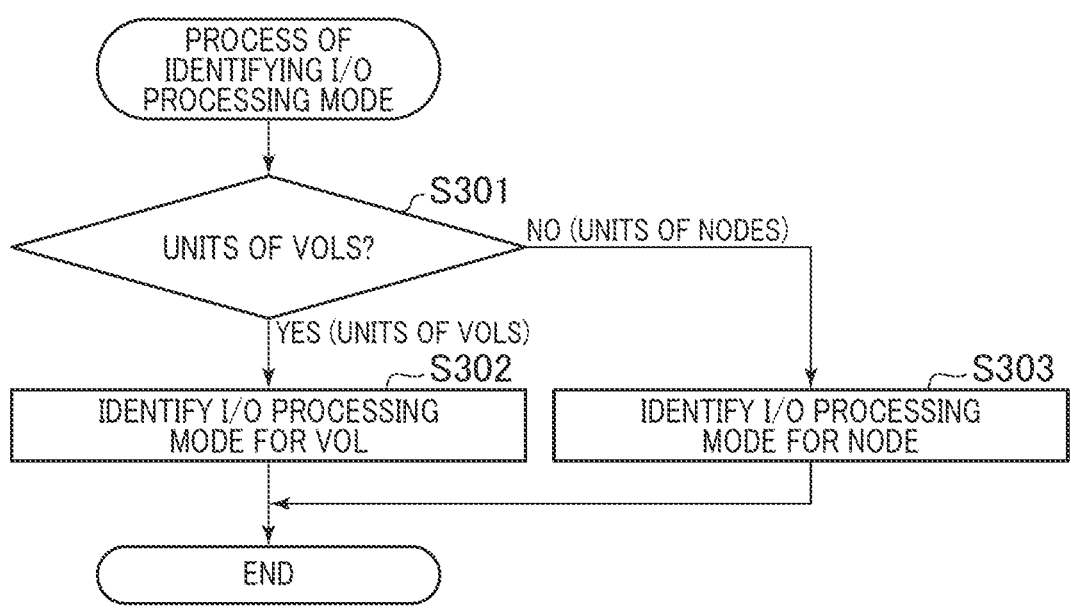
FIG. 11 is a flowchart depicting an example of a detailed procedure for a process of identifying the I/O process mode.

FIG. 11 is a flowchart depicting a detailed procedure for the process of identifying the I/O process mode. The process, depicted in FIG. 11, of identifying the I/O process mode corresponds to the process of step S204 depicted in FIG. 10. In the data writing process (described later), the process, depicted in FIG. 11, of identifying the I/O process mode is executed (refer to step S504 depicted in FIG. 13).

Referring to FIG. 11, in step S301, the I/O controller 203 refers to I/O process mode applicable range information 226 on the I/O controller 203 and determines whether destinations to which the I/O process mode is applied are set in "units of volumes".

When the destinations to which the I/O process mode is applied are set in "units of volumes" (YES in step S301), I/O process modes set for the volumes 204 may be different. Thus, the I/O controller 203 refers to the I/O process mode 2235 indicated in the VOL management table 223 and identifies the I/O process mode set for the target volume 204 (corresponding to the reading source VOL identified in step S203 depicted in FIG. 10 when the I/O process is the data reading process or corresponding to a writing destination VOL identified in step S503 depicted in FIG. 13 when the I/O process is the data writing process) (in step S302).

When the destinations to which the I/O process mode is applied are not set in "units of volumes" or are set in "units of nodes" (NO in step S301), the same I/O process mode is set for the entire node (or for all the volumes 204) recognizable by the I/O controller 203. Thus, the I/O controller 203 refers to the node unit I/O process mode information 227, identifies the I/O process mode set for the concerned node and indicating the I/O process mode set for the target volume 204 (in step S303).

By executing the process of step S302 or S303, the I/O controller 203 can identify the I/O process mode set for the target volume 204. Then, the I/O controller 203 terminates the process of identifying the I/O process mode.

As described in detail with reference to FIG. 11, when the process of identifying the I/O process mode in step S204 is terminated, the I/O controller 203 executes the "read data reading process" of reading the read data from the volume 204 (reading source VOL) identified in step S203 in step S205.

Figure 12:
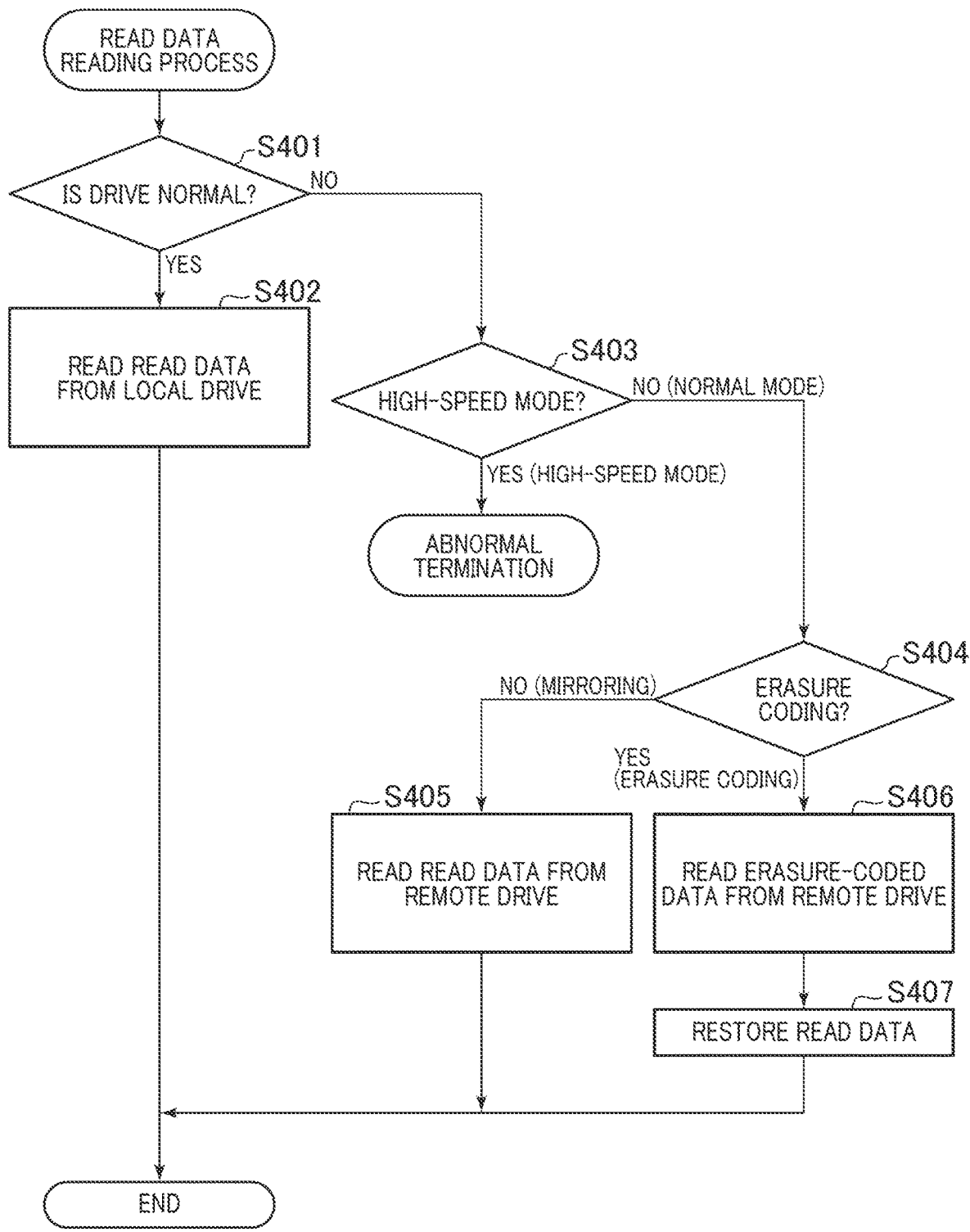
FIG. 12 is a flowchart depicting an example of a detailed procedure for a read data reading process.

FIG. 12 is a flowchart depicting an example of a detailed procedure for the read data reading process. The read data reading process depicted in FIG. 12 corresponds to the process of step S205 depicted in FIG. 10.

Referring to FIG. 12, in step S401, the I/O controller 203 determines whether the concerned drive 23 is normal. The concerned drive 23 is a local drive storing the data (read data) to be read.

When the concerned drive 23 is normal (YES in step S401), the process proceeds to step S402, and the I/O controller 23 reads the read data from the concerned drive (local drive). Then, the I/O controller 23 terminates the read data reading process.

When the concerned drive 23 is not normal (NO in step S401), the I/O controller 23 cannot read the read data from the concerned drive 23 and executes processes of steps S403 and later to read the read data from protected data (or redundant data).

In step S403, the I/O controller 203 determines whether the I/O process mode set for the reading source VOL is the high-speed mode based on the identification result of the process of identifying the I/O process mode (in step S204 depicted in FIG. 10).

When the I/O process mode is the high-speed mode (YES instep S403), the data is not protected in the reading source VOL (details are described in the following description of the data writing process). Thus, in this case, the I/O controller 203 cannot read the protected data (or redundant data) of the read data from another drive 23 and terminates the read data reading process as abnormal termination. As a result, the data reading process depicted in FIG. 10 is terminated as abnormal termination.

When the I/O process mode is not the high-speed mode or is the normal mode (NO in step S403), the data stored in the reading source VOL is protected (by the distributed erasure coding or the mirroring in this example). In this case, the I/O controller 203 refers to the VOL management table 223 (especially, the data protection mode 2234) and determines whether a data protection mode of the reading source VOL is the erasure coding (in step S404).

When the data protection mode is not the erasure coding (NO in step S404), the data is protected by the mirroring and the I/O controller 203 reads the read data from a drive 23 (remote drive) to be subjected to the mirroring (in step S405) and terminates the read data reading process.

When the data protection mode is the erasure coding (YES in step S404), the I/O controller 203 reads, from the other drive (remote drive), erasure-coded data, distributed and held by the erasure coding, of the read data (in step S406), and uses the erasure-coded data to restore the read data (in step S407). Then, the I/O controller 203 terminates the read data reading process.

As described above in detail with reference to FIG. 12, when the read data reading process of step S205 is terminated, the I/O controller 203 determines whether the I/O process mode set for the volume 204 from which the read data has been read is the high-speed mode (in step S206). The determination of step S206 is the same as or similar to the process of step S403 depicted in FIG. 12, for example.

When the I/O process mode is the high-speed mode (YES instep S206), the I/O controller 203 transmits the read data read in the read data reading process of step S205 to the computing node 1 that has issued the read request (in step S207). After the completion of the transmission of the read data, the I/O controller 203 transmits, to the computing node 1, a read response indicating the completion of the data reading (in step S208). After that, the I/O controller 203 terminates the data reading process.

When the I/O process mode is not the high-speed mode or is the normal mode (NO in step S206), the read data read in the read data reading process of step S205 has been compressed, and thus the I/O controller 203 decompresses the read data read in the read data reading process (in step S209). After that, the I/O controller 203 transmits the decompressed read data to the computing node 1 that has issued the read request (in step S207). After the transmission of the decompressed read data, the I/O controller 203 transmits the read response (in step S208). After that, the I/O controller 203 terminates the data reading process.

In the data reading process according to the first embodiment, when the I/O process mode set for the volume 204 from which the read data has been read is the high-speed mode (YES in step S206), the decompression process of step S209 is not executed to reduce a processing load to be applied to the I/O controller 203.

(1-5) Data Writing Process

Figure 13:
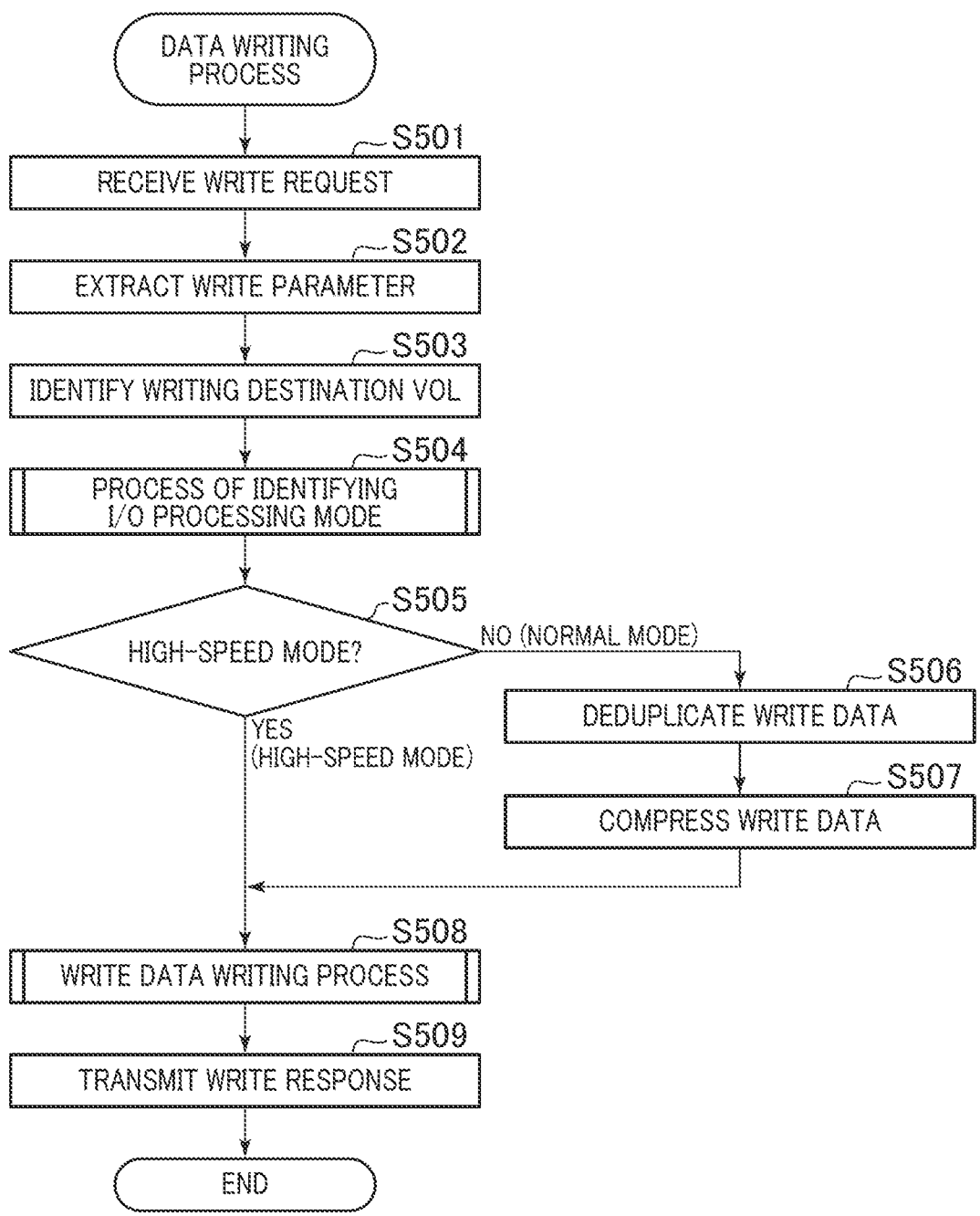
FIG. 13 is a flowchart depicting an example of a procedure for a data writing process.

FIG. 13 is a flowchart depicting an example of a procedure for the data writing process. When a computing node 1 issues, to a storage node 2, a request (write request) to write data, an I/O controller 203 of the storage node 2 receives the write request and executes the data writing process depicted in FIG. 13. Similarly to the data reading process depicted in FIG. 10, the data writing process is executed regardless of whether the system is in the normal state or a failure occurs in the system. In the normal state, the I/O process mode is set to the normal mode for all the volumes. When a failure occurs, the I/O process mode may be set to the normal mode for one or more of the volumes, and the I/O process mode may be set to the high-speed mode for one or more of the volumes.

Referring to FIG. 13, in step S501, the I/O controller 203 receives the write request. Then, the I/O controller 203 extracts a write parameter from the write request received in step S501 (in step S502) and identifies a volume 204 (write destination VOL) to which the write data is to be written (in step S503).

In step S504, the I/O controller 203 executes the "process of identifying the I/O process mode" to identify the I/O process mode set for the volume 204 (write destination VOL) identified in step S503. The detailed procedure for the process of identifying the I/O process mode is described above with reference to FIG. 11 and will not described in detail.

Next, in step S505, the I/O controller 203 determines, based on the identification result of the process of identifying the I/O process mode in step S504, whether the I/O process mode set for the write destination VOL is the high-speed mode.

When the I/O process mode is the high-speed mode (YES instep S505), the I/O controller 203 does not execute the special processes (specifically, the compression and the deduplication) and the process proceeds to step S508. In step S508, the I/O controller 203 executes a "write data writing process" to write, to a drive 23, the write data received based on the write request issued in step S501.

When the I/O process mode is not the high-speed mode or is the normal mode (NO in step S505), the compression and the deduplication need to be executed on the write data before the writing of the write data to the drive 23. Thus, the I/O controller 203 deduplicates the write data (in step S506) and compresses the write data after the deduplication (in step S507). By executing the compression and the deduplication, the size of the write data can be smaller than the size of the write data when the write data is received based on the write request issued in step S501. Then, the I/O controller 203 uses the write data after the compression and the deduplication to execute the "write data writing process" of step S508.

Figure 14:
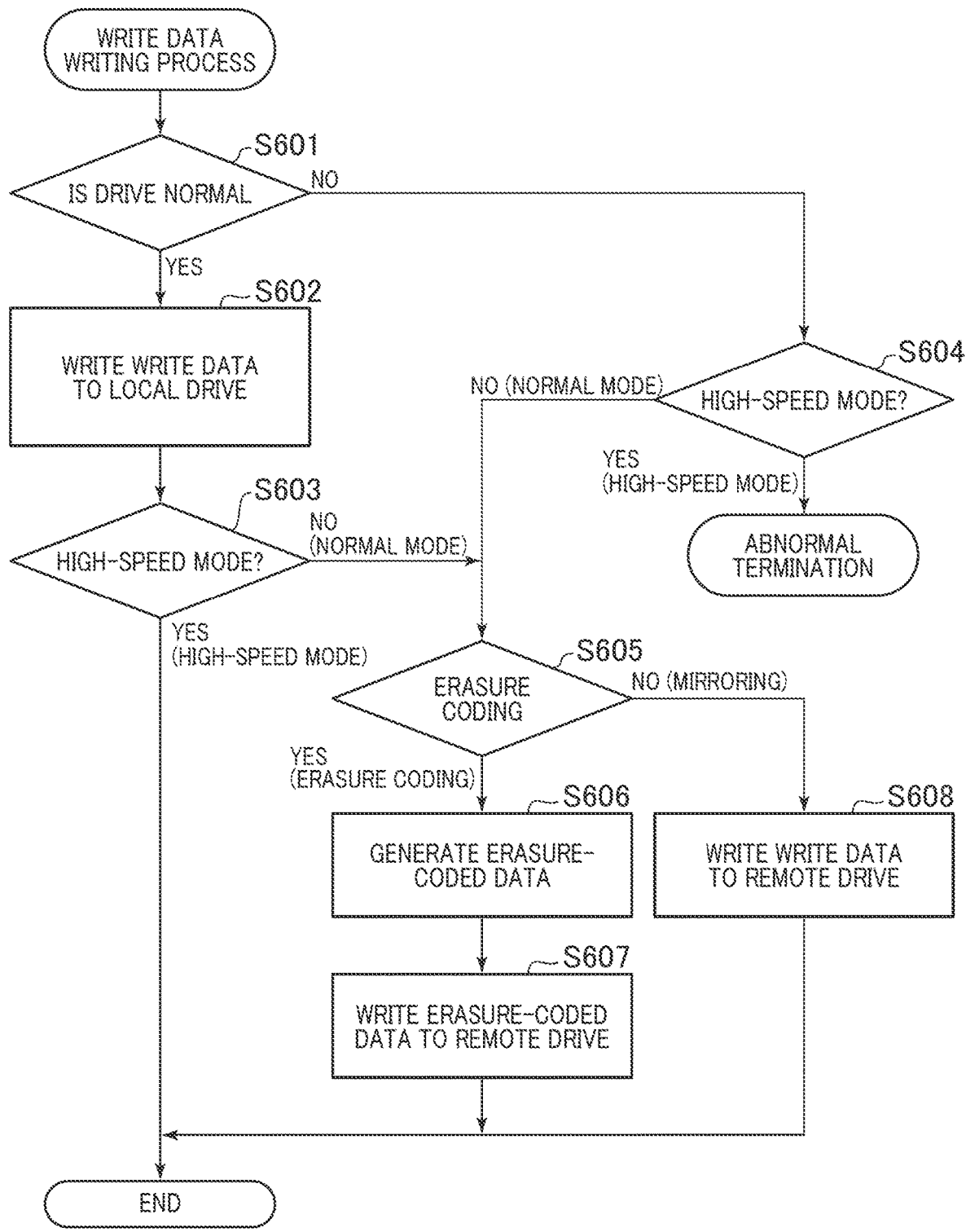
FIG. 14 is a flowchart depicting an example of a detailed procedure for a write data writing process.

FIG. 14 is a flowchart depicting an example of a detailed procedure for the write data writing process. The write data writing process depicted in FIG. 14 corresponds to the process of step S508 depicted in FIG. 13.

Referring to FIG. 14, in step S601, the I/O controller 203 determines whether the concerned drive is normal. The concerned drive 23 is a local drive that is a destination to which the write data is to be written in the normal state.

When the concerned drive 23 is normal (YES in step S601), the process proceeds to step S602. In step S602, the I/O controller 203 writes the write data to the concerned drive (local drive). After that, the process proceeds to step S603.

In step S603, the I/O controller 203 determines whether the I/O process mode set for the write destination VOL is the high-speed mode based on the identification result of the process of identifying the I/O process mode (in step S504 depicted in FIG. 13). When the I/O process mode is the high-speed mode (YES in step S603), a data protection process (specifically, the erasure coding or the mirroring) is not executed and the write data writing process is terminated. When the I/O process mode is not the high-speed mode or is the normal mode (NO in step S603), the process proceeds to step S605 to execute the data protection on the write data.

When the concerned drive 23 is not normal (NO in step S601), the write data cannot be written to the concerned drive 23 and the process proceeds to step S604.

In step S604, the I/O controller 203 determines whether the I/O process mode set for the write destination VOL is the high-speed mode based on the identification result of the process of identifying the I/O process mode (in step S504 depicted in FIG. 13). When the I/O process mode is the high-speed mode (YES instep S604), the I/O controller 203 cannot write the write data to any of the drives 23 and thus terminates the write data writing process as abnormal termination. As a result, the data writing process depicted in FIG. 13 is also terminated as abnormal termination. When the I/O process mode is not the high-speed mode or is the normal mode (NO in step S604), the process proceeds to step S605 to write the write data to another drive 23 (remote drive) by executing the data protection.

In step S605, the I/O controller 203 refers to the VOL management table 223 (especially, the data protection mode 2234) and determines whether a data protection mode of the write destination VOL is the erasure coding.

When the data protection mode is the erasure coding (YES in step S605), the I/O controller 203 generates erasure-coded data of the write data (in step S606) and writes the generated erasure-coded data to the other drive 23 (remote drive) for holding the erasure-coded data in a distributed manner by the erasure coding (in step S607). After that, the I/O controller 203 terminates the write data writing process.

When the data protection mode is not the erasure coding (NO in step S605), the data is to be protected by the mirroring, and thus the I/O controller 203 writes the write data to a drive 23 (remote drive) to be subjected to the mirroring (in step S608). After that, the I/O controller 203 terminates the write data writing process.

As described above in detail with reference to FIG. 14, after the write data writing process of step S508 is terminated, the I/O controller 203 transmits a write response indicating the completion of the data writing to the computing node 1 that has issued the write request (in step S509). Then, the I/O controller 203 terminates the data writing process.

As described above, in the data writing process according to the first embodiment, when the I/O process mode set for the volume 204 to which the write data is to be written is the high-speed mode, a processing load to be applied to the I/O controller 203 may be reduced by skipping the deduplication process of step S506 and the compression process of step S507. In addition, as described in the explanation of the write data writing process depicted in FIG. 14, when the I/O process mode set for the drive 23 to which the write data has been written is the high-speed mode (YES in step S603), the processing load to be applied to the I/O controller 203 may be reduced by skipping the execution of the data protection on the write data by the erasure coding or the mirroring.

(1-6) Conclusion

As described above, in the first embodiment, when a failure occurs in a node, the process of changing the I/O process mode in steps S102 to S106 depicted in FIG. 9 is executed, and when a load state of the I/O controller 203B on which a load is expected to be concentrated is an overload, the I/O process mode is changed to the high-speed mode for at least any of the volumes 204 controllable by the I/O controller 203B. In the high-speed mode, the functionality of the storage service is suppressed. As a result, the processing load of the I/O controller 203B is reduced, compared with that in the normal mode. Thus, even when the failover of the I/O controller 203A is executed, the I/O controller 203B can continuously provide the storage service while maintaining the SLA on the storage performance. In this case, an extra storage resource for maintaining the SLA does not need to be added.

In the process of changing the I/O process mode according to the first embodiment, even when a failure occurs in a node, processing performance of the other node (I/O controller 203B) forming the dual-controller 202 is not at the maximum level of the processing performance, and a load is concentrated due to the failover, it is considered that the SLA can be maintained, and thus the I/O process mode is not changed from the normal mode as described in the case where the answer to step S102 is NO. As a result, even when the failover is executed upon a failure, the I/O controller 203B can maintain the SLA without a reduction in the functionality of the storage service. In this case, an extra storage resource for maintaining the SLA does not need to be added.

The I/O process mode is not switched to the high-speed mode in the process of changing the I/O process mode when the SLA on the storage performance can be maintained. Thus, the storage service can be continuously provided, while a reduction, caused by the high-speed mode, in the functionality is suppressed as much as possible and the SLA on the storage performance is maintained without addition of an extra storage resource.

In the storage system according to the first embodiment, even when a node is made unusable upon the occurrence of a failure, the node does not need to include many extra storage resources to maintain the performance upon the failure, storage resources can be efficiently used, and the SLA on the storage performance to be provided to the tenants can be maintained. It is, therefore, possible to obtain an effect of reducing an extra storage resource for the operation of IaaS/PaaS.

(2) Second Embodiment

A storage system according to a second embodiment is configured by modifying the storage system according to the first embodiment to suppress a reduction in the performance of the data protection. The storage system according to the second embodiment is described below in detail.

Figure 15:
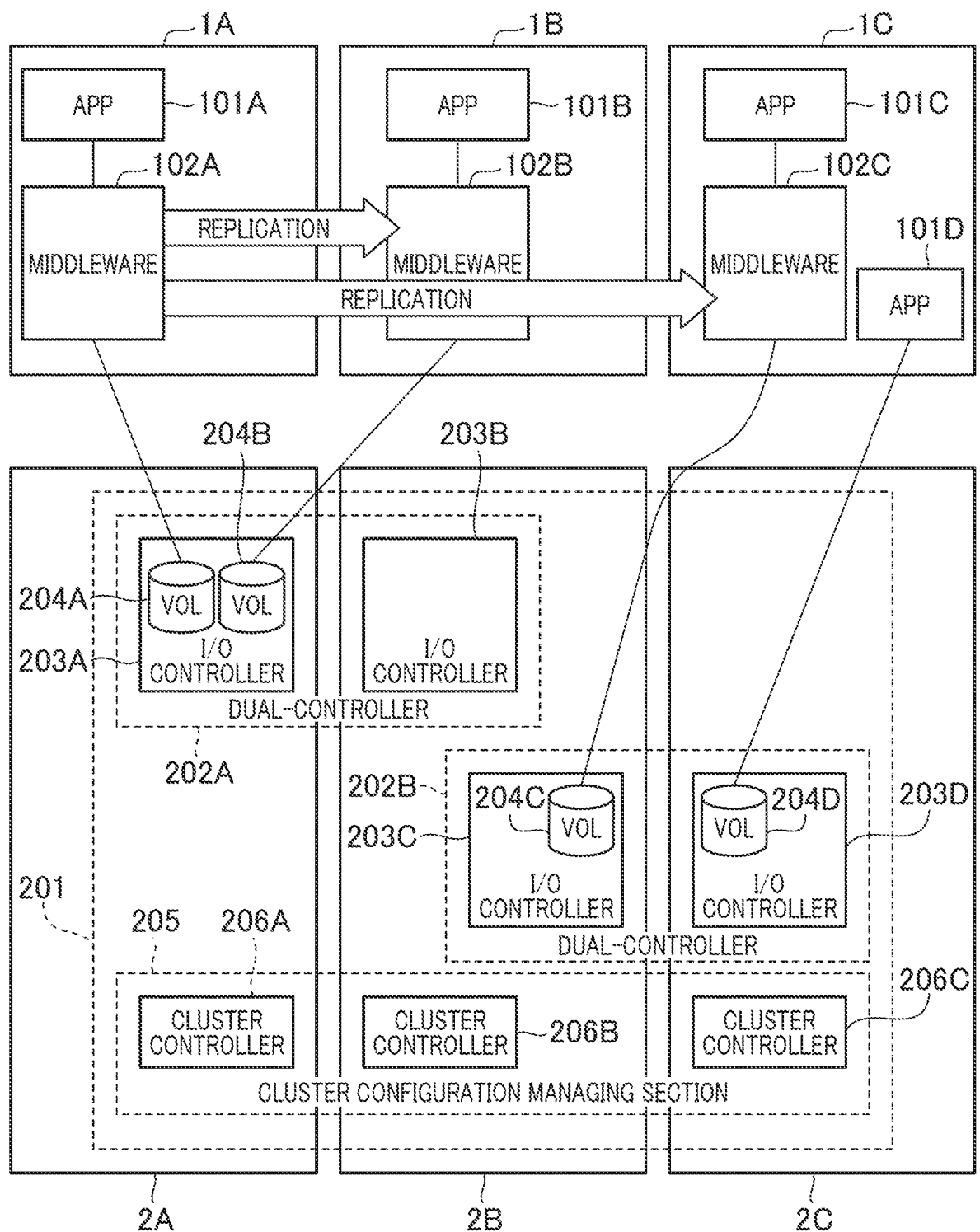
FIG. 15 is a block diagram depicting an example of software architecture in a storage system according to a second embodiment.

FIG. 15 is a block diagram depicting an example of software architecture in the storage system according to the second embodiment. Configurations that are among configurations depicted in FIG. 15 and are common to the configurations depicted in FIG. 3 in the first embodiment will not be described in detail. An entire configuration and hardware configuration of the storage system according to the second embodiment are the same as or similar to those depicted in FIGS. 1 and 2 and are not depicted.

In FIG. 15, the apps 101A to 101c are executed on middleware 102A to 102C. This feature is different from FIG. 3. When the apps 101 are executed on the middleware 102, I/O requests are issued by the apps 101 to the storage nodes 2 via the middleware 102. In addition, an app 101D is an application to be independently executed and uses only a volume 204D.

FIG. 15 depicts that the middleware 102A, 102B, and 102C execute replication on the side of the computing nodes 1. Specifically, the middleware 102A duplicates and synchronizes data between the middleware 102A and the middleware 102B and 102C. For example, in FIG. 15, data on the app 101A (or the apps 101B and 101C) is duplicated and held in the volumes 204A, 204B, and 204C. This situation, which is viewed from the side of each of the volumes 204, indicates that application-level replication is being executed (Yes). In FIG. 15, the app 101D is not subjected to the replication by the middleware 102, and data on the app 101D is held in only the volume 204D. This situation, which is viewed from the side of the volume 204, indicates that the application-level replication is not being executed (No). Although not depicted, middleware 102 that does not execute the data protection may exist.

In the second embodiment, the VOL management table 223 that is among the data held in the memory 22 included in each storage node 2 and exemplified in FIG. 4 is replaced with a VOL management table 228 having a new data item.

FIG. 16 is a diagram describing an example of a data configuration of the VOL management table according to the second embodiment. Data items from a VOL ID 2281 to an I/O process mode 2285 in the VOL management table 228 depicted in FIG. 16 correspond to the items depicted in FIG. 4 and having the same names as the items depicted in FIG. 16 and will not be described.

Application-level replication 2228 of the VOL management table 228 indicates whether the application-level replication is being executed (Yes/No) on each of volumes 204 corresponding to the VOL ID 2281. Specifically, for example, in FIG. 15, the application-level replication is being executed on each of the volumes 204A to 204C (Yes) and is not being executed on the volume 204D (No).

Next, various processes to be executed in the storage system according to the second embodiment are described.

In the second embodiment, a part of the process of changing the I/O process mode is executed in a process procedure different from the procedure exemplified in FIG. 9 in the first embodiment. Specifically, the process (of selecting a VOL for which the I/O process mode is to be changed) of "selecting a volume 204 for which the I/O process mode is to be changed to the high-speed mode" is executed by an I/O controller 203 in a process procedure different from that described in the first embodiment. The data reading process and the data writing process can be executed in the same procedures as those described in the first embodiment (refer to FIGS. 10 to 14) and will not be described in detail.

Figure 17:
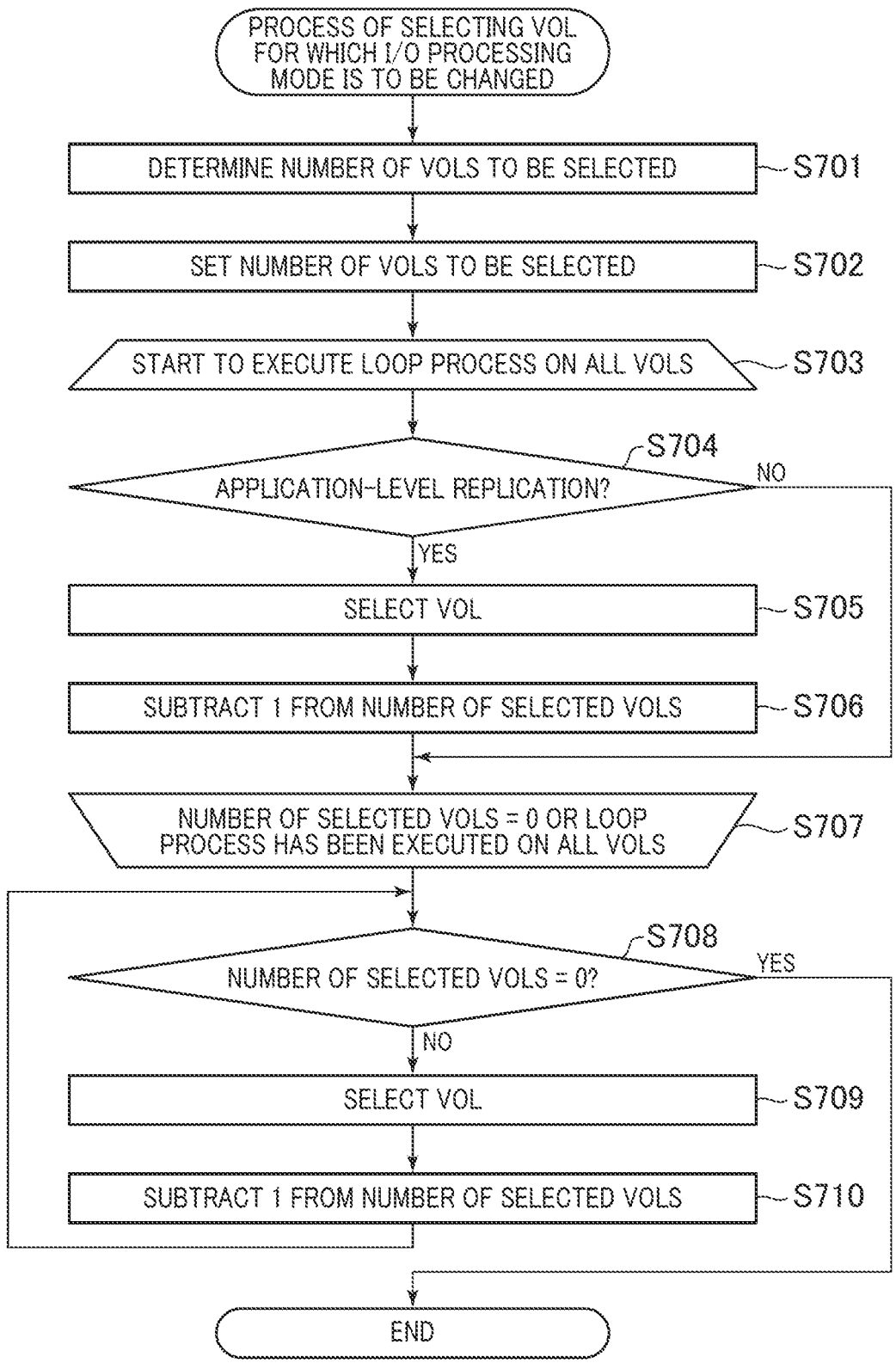
FIG. 17 is a flowchart depicting an example of a procedure for a process of selecting a VOL for which the I/O process mode is to be changed.

FIG. 17 is a flowchart depicting an example of a procedure for the process of selecting a VOL for which the I/O process mode is to be changed. The process of selecting a VOL for which the I/O process mode is to be changed is included in the process of changing the I/O process mode when a failure of a node (storage node 2) within the cluster 201 is detected. The process of selecting a VOL for which the I/O process mode is to be changed is executed by an I/O controller 203 to which an I/O controller 203 is switched due to failover upon a failure. FIG. 17 describes the process procedure under the condition that the volumes 204 built in the storage nodes 2 have the same size and are coupled to each other by clustering in order to simplify the description. When the sizes of the volumes 204 are different, the number (described later) of VOLs to be selected is not used and it is sufficient if a volume for which the I/O process mode is to be changed to the high-speed mode is selected while the total size of the VOLs is calculated and a process of continuously selecting a volume until a required size is secured or the like is executed.

Referring to FIG. 17, the I/O controller 203 determines the number of volumes (mode change VOLs) that are to be selected and for which the I/O process mode is to be changed to the high-speed mode (in step S701). In step S702, the I/O controller 203 sets, to a predetermined parameter, the number (selection VOL number), determined in step S701, of mode change VOLs to be selected.

Next, the I/O controller 203 sequentially executes a loop process of steps S703 to S707 on each of all volumes 204 controllable by the I/O controller 203 until a requirement for the termination of the loop process is satisfied in step S707.

In step S704, the I/O controller 203 refers to the VOL management table 228 and determines whether the application-level replication is being executed on a volume 204 among the volumes 204 to be processed. When the application-level replication is being executed on the volume 204 (Yes in step S704), the I/O controller 203 selects the volume 204 as a mode change VOL (in step 705) and subtracts 1 from the parameter indicating the number of VOLs to be selected (in step S706). After that, the process proceeds to step S707. When the application-level replication is not being executed (No in step S704), the process proceeds to step S707.

When the requirement for the termination of the loop process is confirmed and is not satisfied in step S707, the process returns to step S703 to repeatedly execute the loop process on a next volume 204 as a volume to be processed. The requirement for the termination of the loop process is that the parameter indicating the number of VOLs to be selected is 0 or that the I/O controller 203 has executed the loop process on all the volumes 204 controllable by the I/O controller 203. By the loop process of steps S703 to S707, a volume 204 on which the application-level replication is being executed can be selected as a mode change VOL on a priority basis. When the requirement for the termination of the loop process is satisfied in step S707, the process proceeds to step S708.

In step S708, the I/O controller 203 determines whether the parameter indicating the number of VOLs to be selected is 0. When the parameter indicating the number of VOLs to be selected is not 0 (NO in step S708), a mode change VOL needs to be selected and thus the I/O controller 203 selects, as a mode change VOL, one of volumes 204 (or volumes 204 in which an application-level replication does not exist) that are among all the volumes 204 controllable by the I/O controller 203 and are not selected as mode change VOLs (in step S709). Then, the I/O controller 203 subtracts 1 from the parameter indicating the number of VOLs to be selected (in step S710) and the process returns to step S708.

When the parameter indicating the number of VOLs to be selected is 0 (YES in step S708), mode change VOLs have been selected for the number, determined in step S701, of VOLs to be selected, and thus the process of selecting a mode change VOL for which the I/O process mode is to be changed is terminated.

Since the process of selecting a mode change VOL for which the I/O process mode is to be changed is executed in steps S701 to S710, the I/O controller 203 can actively select a volume subjected to the replication from among the volumes controllable by the I/O controller 203 and passively select a volume not subjected to the replication from among the volumes controllable by the I/O controller 203 as volumes (mode change VOLs) for which the I/O process mode is to be changed to the high-speed mode.

The process procedure depicted in FIG. 17 is an example and may be another process procedure as long as the process is executed to select, as a mode change VOL as a priority basis, a volume 204 in which data is highly protected. For example, detailed priorities may be given to the volumes 204 based on application levels, and a mode change VOL may be selected based on the priorities.

In the second embodiment, since the process of changing the I/O process mode is executed based on the process of selecting a VOL for which the I/O process mode is to be changed, the I/O process mode can be changed to the high-speed mode fora volume 204 storing data protected by the replication on a priority basis.

The data protection by the replication is executed and controlled by the computing nodes 1 (or by the middleware 102). Thus, even when the I/O process mode is changed to the high-speed mode for a storage node 2 and the data protection by the erasure coding or the mirroring is not subjected to, for example, the volume 204A, copies are held in the other volumes 204B and 204C by the replication. Specifically, the reliability of data protected by the replication and held in the volumes 204A to 204C on which the replication has been executed and that are used by the middleware 102A to 102C (applications 101A to 101C) is secured in the computing nodes 1. Thus, even when the I/O process mode is changed to the high-speed mode in which the reliability of data may be reduced in the storage node 2, a reduction in the reliability of data in the entire storage system can be suppressed. Data held in the volume 204D used by the application 101D is not protected by the replication by the middleware 102. Thus, when the I/O process mode is changed to the high-speed mode for the volume 204D, the data held in the volume 204D is not copied and the reliability of data in the entire storage system may be reduced.

In the storage system according to the second embodiment, since the process of changing the I/O process mode is executed upon a failure, the I/O process mode can be actively changed to the high-speed mode for a volume 204, which stores data of which reductions in the reliability and the availability can be allowed in consideration of the reliability and availability of data in the entire storage system, and the I/O process mode can be passively changed to the high-speed mode for a volume 204, which stores data for which it is difficult to reduce the reliability and the availability.

In the storage system according to the second embodiment, while an effect on the availability and reliability of the entire storage system is minimized, it is possible to suppress a reduction (reduction in the reliability of data), caused by the setting of the high-speed mode, in the functionality of the storage service and reduce the processing loads of the I/O controllers 203. In addition, an effect that is the same as or similar to that obtained in the first embodiment can be obtained.

As described in the first and second embodiments, according to the storage system according to the invention and the storage system control method according to the invention, even when a node is made unusable due to the occurrence of a failure, the node does not need to include many extra storage resources to maintain performance upon the failure, and it is possible to efficiently use storage resources to maintain the SLA on the storage performance to be provided to the tenants.

In view of the aforementioned effects, an efficient operation of storage resources can be executed as follows.

For example, even when performance (specifications) of each of the nodes in the storage system is low, an SLA equivalent with a conventional SLA can be maintained by efficiently using the high-speed mode, and thus the server may be switched to a relatively low spec server. For example, in the storage system, the number of nodes can be reduced without a change in specifications of the server. Alternatively, in the case where the specifications of the server and the number of nodes are not changed, even when processing loads are higher than those in conventional techniques, the operation is possible and the number of clusters required for the operation can be reduced.

Since an effect of suppressing the cost of the storage system and the service operation is obtained in each of the aforementioned cases, the SLA on the tenants can be maintained with low cost and it is effective to guarantee the quality of service (QoS) in IaaS/PaaS business.

The invention is not limited to the aforementioned embodiments and includes various modified examples. For example, the embodiments are described above in detail to clearly explain the invention. Not all the configurations described above in the embodiments are necessarily provided. A configuration may be added to, removed from, and replaced with one or more of the configurations described in the embodiments.

The aforementioned configurations, functions, processing units, processing sections, and the like may be enabled by hardware or by designing integrated circuits or the like. The aforementioned configurations, functions, and the like may be enabled by software or by causing a processor to interpret and execute a program for enabling the functions. Information of the program for enabling the functions, the tables, files, and the like may be stored in a storage device such as a memory, a hard disk, or a solid state drive (SSD) or a storage medium such as an IC card, an SD card, or a DVD.

Control lines and information lines that are considered to be necessary for the description are depicted in the drawings. All control lines and information lines in a product are not necessarily depicted. In fact, it may be considered that almost all the configurations are connected to each other in each of the embodiments.

What is claimed is:

1. A storage system including a plurality of storage nodes for providing storage regions for storing data of a computer in which an application is executed, the storage system comprising a controller configured to:

switch setting a process mode, for processing a request for input and output of data, between a normal mode indicating a normal state and an emergency mode in which a predetermined function is suppressed compared with the normal mode;

in response to the occurrence of a failure in a first storage node among the plurality of storage nodes, determine whether or not to switch to the emergency mode for a second storage node in which the failure does not occur; and based on the determination, switch the process mode to the emergency mode or maintain the process mode in the normal mode.

2. The storage system according to claim 1,
wherein the controller comprises a first input and output (I/O) controller included in the first storage node and a second I/O controller included in the second storage node, and the controller determines whether or not the process mode is switched based on a processing load of the second I/O controller included in the second storage node.

3. The storage system according to claim 1,
wherein the process mode is switched for all volumes controllable by the the controller or in units of the volumes.

4. The storage system according to claim 1,
wherein in the normal mode, the data is compressed or deduplicated, and
wherein in the emergency mode, the compression or deduplication executed on the data in the normal mode is stopped.

5. The storage system according to claim 1,
wherein in the normal mode, distributed erasure coding is executed on the data, and
wherein in the emergency mode, the distributed erasure coding executed on the data is stopped.

6. The storage system according to claim 1,
wherein in the normal mode, mirroring is executed on the data, and
wherein in the emergency mode, the mirroring executed on the data is stopped.

7. The storage system according to claim 1,
wherein the computer includes middleware on which the application is executed,
wherein in the second storage node, based on whether the middleware that uses a volume executes replication, it is determined whether the process mode is switched for the volume.

8. The storage system according to claim 7,
wherein in the second storage node, the volume on which the replication is executed by the middleware is subjected to the switching of the process mode on a priority basis.

9. A method for controlling a storage system including a plurality of storage nodes for providing storage regions for storing data of a computer in which an application is executed, the method comprising:
switching setting a process mode, for processing a request for input and output of data, between a normal mode indicating a normal state and an emergency mode in which a predetermined function is suppressed compared with the normal mode;
in response to the occurrence of a failure in a first storage node among the plurality of storage nodes, determine whether or not to switch to the emergency mode for a second storage node in which the failure does not occur; and
based on the determination, switch the process mode to the emergency mode or maintain the process mode in the normal mode.

10. The method according to claim 9,
wherein whether the process mode is switched is determined based on a processing load of a controller included in the second storage node.

11. The method according to claim 9,
wherein in the normal mode, the data is compressed or deduplicated, and
wherein in the emergency mode, the compression or deduplication executed on the data in the normal mode is stopped.

12. The method according to claim 9,
wherein in the normal mode, distributed erasure coding is executed on the data, and
wherein in the emergency mode, the distributed erasure coding executed on the data is stopped.

13. The method according to claim 9,
wherein in the normal mode, mirroring is executed on the data, and
wherein in the emergency mode, the mirroring executed on the data is stopped.

14. The method according to claim 9,
wherein the computer includes middleware on which the application is executed, and
wherein in the second storage node, based on whether the middleware that uses a volume executes replication, it is determined whether the process mode is switched for the volume.

15. The method according to claim 14,
wherein in the second storage node, the volume on which the middleware executes the replication is subjected to the switching of the process mode on a priority basis.

* * * * *